(12) United States Patent
Ku

(10) Patent No.: US 10,116,337 B2
(45) Date of Patent: Oct. 30, 2018

(54) DECODING METHOD FOR CONVOLUTIONALLY CODED SIGNAL

(71) Applicant: MStar Semiconductor, Inc., Hsinchu Hsien (TW)

(72) Inventor: Yu-Hsien Ku, Hsinchu County (TW)

(73) Assignee: MSTAR SEMICONDUCTOR, INC., Hsinchu (TW)

( * ) Notice: Subject to any disclaimer, the term of this patent is extended or adjusted under 35 U.S.C. 154(b) by 211 days.

(21) Appl. No.: 14/992,269

(22) Filed: Jan. 11, 2016

(65) Prior Publication Data
US 2016/0204803 A1 Jul. 14, 2016

(30) Foreign Application Priority Data

Jan. 12, 2015 (TW) .............................. 104100915 A

(51) Int. Cl.
| | | |
|---|---|---|
| H03M 13/23 | (2006.01) | |
| H03M 13/25 | (2006.01) | |
| H03M 13/29 | (2006.01) | |
| H03M 13/39 | (2006.01) | |
| H03M 13/41 | (2006.01) | |

(52) U.S. Cl.
CPC ..... *H03M 13/3972* (2013.01); *H03M 13/256* (2013.01); *H03M 13/258* (2013.01); *H03M 13/3905* (2013.01); *H03M 13/3938* (2013.01); *H03M 13/413* (2013.01); *H03M 13/23* (2013.01); *H03M 13/2957* (2013.01)

(58) Field of Classification Search
CPC ......... H03M 13/3972; H03M 13/3938; H03M 13/23; H03M 13/2957; H03M 13/256; H03M 13/258; H03M 13/3905; H03M 13/413

USPC ....... 714/792, 794–796, 786, 375, 262, 265, 714/341, 240.24, 240.27
See application file for complete search history.

(56) References Cited

U.S. PATENT DOCUMENTS

| | | | | |
|---|---|---|---|---|
| 6,088,405 A | * | 7/2000 | Hladik ................. | H03M 13/23 375/341 |
| 6,393,076 B1 | * | 5/2002 | Dinc ................... | H03M 13/2957 375/341 |
| 6,452,979 B1 | * | 9/2002 | Ariel ................... | H03M 13/2957 375/265 |
| 6,665,308 B1 | * | 12/2003 | Rakib ................. | H03M 13/256 348/E7.07 |
| 6,829,313 B1 | * | 12/2004 | Xu ..................... | H03M 13/2975 375/262 |

(Continued)

FOREIGN PATENT DOCUMENTS

TW 201206091 2/2012

OTHER PUBLICATIONS

Taiwan Intellectual Property Office (TIPO), Office Action dated May 24, 2016.

*Primary Examiner* — John J Tabone, Jr.
(74) *Attorney, Agent, or Firm* — WPAT, PC

(57) ABSTRACT

A decoding method for a convolutionally coded signal is provided. The convolutionally coded signal includes a trellis. The decoding method includes determining a plurality of first sub-trellises from the trellis, decoding the first sub-trellises, determining a plurality of second sub-trellises from the trellis, boundaries of the second sub-trellises being different from boundaries of the first sub-trellises, and decoding the second sub-trellises.

18 Claims, 4 Drawing Sheets

(56) References Cited

U.S. PATENT DOCUMENTS

| | | | | |
|---|---|---|---|---|
| 6,856,657 B1* | 2/2005 | Classon | ............ | H03M 13/3905 375/341 |
| 6,868,132 B1* | 3/2005 | Classon | ............ | H03M 13/3723 375/341 |
| 6,901,117 B1* | 5/2005 | Classon | ............ | H03M 13/3723 375/341 |
| 7,127,664 B2* | 10/2006 | Nicol | ................ | H03M 13/2957 375/262 |
| 7,139,967 B2* | 11/2006 | Feldman | ............... | H03M 13/23 714/794 |
| 7,234,100 B1* | 6/2007 | Sadowsky | ......... | H03M 13/3905 714/792 |
| 8,127,214 B2* | 2/2012 | Trofimenko | ....... | H03M 13/1105 714/786 |
| 8,340,204 B2* | 12/2012 | Fatemi-Ghomi | ........................... | H03M 13/3955 375/262 |
| 8,650,468 B2* | 2/2014 | Fisher-Jeffes | ..... | H03M 13/2957 714/792 |
| 2001/0001616 A1* | 5/2001 | Rakib | ................ | H03M 13/256 375/259 |
| 2002/0090041 A1* | 7/2002 | Marsili | ................ | H03M 13/15 375/341 |
| 2002/0095639 A1* | 7/2002 | Ahmed | ................ | H03M 13/00 714/786 |
| 2002/0104054 A1* | 8/2002 | Shin | ................ | H03M 13/2746 714/755 |
| 2002/0119803 A1* | 8/2002 | Bitterlich | ........... | H03M 13/6511 455/552.1 |
| 2002/0129317 A1* | 9/2002 | Nicol | ................ | H03M 13/2957 714/792 |
| 2002/0144209 A1* | 10/2002 | Ariel | .................... | H03M 13/27 714/792 |
| 2003/0101402 A1* | 5/2003 | Amrani | ............. | H03M 13/2957 714/755 |
| 2003/0126551 A1* | 7/2003 | Mantha | ............. | H03M 13/1102 714/790 |
| 2004/0039769 A1* | 2/2004 | Orio | ........................ | G11B 20/18 708/530 |
| 2005/0097431 A1* | 5/2005 | Nieminen | ............... | H04L 1/005 714/794 |
| 2005/0172204 A1* | 8/2005 | Lin | .................. | H03M 13/2957 714/755 |
| 2006/0026493 A1* | 2/2006 | Cherubini | ......... | H03M 13/3723 714/794 |
| 2007/0162837 A1* | 7/2007 | Nieminen | ......... | H03M 13/2957 714/796 |
| 2008/0104488 A1* | 5/2008 | Cheng | ............... | H03M 13/2957 714/794 |
| 2010/0185925 A1* | 7/2010 | Maunu | ............. | H03M 13/4107 714/792 |
| 2011/0026601 A1* | 2/2011 | Mueller | ............. | H03M 13/1171 375/240.24 |
| 2011/0211659 A1* | 9/2011 | Kosakowski | ....... | H03M 13/413 375/341 |
| 2011/0214040 A1* | 9/2011 | Kosakowski | ......... | H03M 13/09 714/807 |
| 2012/0030536 A1* | 2/2012 | Fisher-Jeffes | ..... | H03M 13/2957 714/755 |

* cited by examiner

DECODING METHOD FOR CONVOLUTIONALLY CODED SIGNAL

This application claims the benefit of Taiwan application Serial No. 104100915, filed Jan. 12, 2015, the subject matter of which is incorporated herein by reference.

BACKGROUND OF THE INVENTION

Field of the Invention

The invention relates in general to a communication system, and more particularly to a soft output decoder for a receiver of convolutional coding communication.

Description of the Related Art

In the process of data transmission of a digital communication system, incorrect messages may be received at a receiver end frequently due to unpredictable interference. Without increasing the transmission power, channel coding, although effectively reduces the error rate, poses a setback of occupying the transmission bandwidth. In view of the increasing demand of data transmission and storage systems of the public, not only the transmission rate will get faster but also the quality of service (QoS) will get higher in the future. As channel coding ensures that an error of the transmission bit is controlled within a certain range, channel coding is a critical consideration in the system design.

Convolutional coding is often used in channel coding to prevent a receiver from receiving incorrect messages. At a transmitting end, a code vector or an information block transmitted may be described by a trellis diagram. The complexity of a trellis diagram is determined by a constraint length of an encoder. Although the operation complexity gets higher as the length of the constraint length gets longer, such coding relatively provides better robustness.

At a receiving end, a soft-decision coder may be adopted to identify a maximum likelihood code vector through a Viterbi algorithm and trellis architecture to perform decoding. However, the operation complexity of a the Viterbi algorithm exponentially increases as the constraint length gets longer. In other words, compared to convolutional coding having a longer constraint length, a Viterbi decoder may require a substantial amount of memory and consume significant power to process the operation.

Turbo coding is proven to render better performance than common coding technologies. A turbo code is formed from processing two or more convolutional codes by a turbo interleaver. To decode turbo codes, convolutional codes are individually decoded by a soft-decision decoder using an iteration approach. A soft-decision decoder decodes a convolutional code to provide extrinsic information, which allows the soft-decision decoder to provide a more accurate result when the soft-decision decoder decodes another convolutional code. In the prior art, soft-decision decoding may adopt a maximum a posterior (MAP) algorithm or a soft output Viterbi algorithm (SOVA), both of which requiring forward recursion and backward recursion for decoding to determine the soft output of one information block. In general, in an environmental with a lower signal-to-noise ratio (SNR), turbo codes render better performance than other convolutional codes.

One type of decoder that directly implements the MAP algorithm performs forward recursion on a trellis of one entire information block, and then performs backward recursion. However, such decoding method not only requires a large amount of memory space but also leads to a severe communication latency, and is not a practically feasible approach.

In the prior art, window technologies are introduced to reduce the required memory space by means of an additional operation amount. That is, the operation amount is trade-off with the memory space. In simple, in window technologies, a code block is divided into a plurality of sub-trellises using a window of a certain size, and only one sub-trellis is decoded each time. As only one sub-trellis is computed, the demand on memory space is smaller. However, window technologies need additional training operations in order to allow the state metric of two boundaries of each sub-trellis to be sufficiently representative.

SUMMARY OF THE INVENTION

A decoding method for a convolutionally coded signal is provided according to an embodiment of the present invention. The convolutionally coded signal includes a trellis. The decoding method includes: determining a plurality of first sub-trellises from the trellis, and determining a predetermined step from each of the first sub-trellises; decoding the first sub-trellises to generate a plurality of state metrics; storing a plurality of state metrics prior and subsequent to the predetermined steps as a first record; determining a plurality of second sub-trellises from the trellis; and decoding the second sub-trellises by utilizing the first record as an initial condition of the second sub-trellises.

A decoding method for a convolutionally coded signal is provided according to another embodiment of the present invention. The convolutionally coded signal includes a trellis. The decoding method includes: determining a plurality of sub-trellises from the trellis; decoding the first sub-trellises; determining a plurality of second sub-trellises from the trellis, boundaries of the second sub-trellises being different from boundaries of the first sub-trellises; and decoding the second sub-trellises.

The above and other aspects of the invention will become better understood with regard to the following detailed description of the preferred but non-limiting embodiments. The following description is made with reference to the accompanying drawings.

DETAILED DESCRIPTION OF THE INVENTION

The present invention is capable of improving window technologies. In addition to eliminating the additional training operations of the prior art, the embodiments of the present invention are also capable of reducing the demand on memory space.

In one embodiment of the present invention, a turbo decoder divides a trellis into a plurality of same-sized sub-trellises in each iteration loop. The sub-trellises have the same sub-trellis length. The turbo decoder then decodes all of the sub-trellises in a parallel manner. Boundaries of old sub-trellises in a previous iteration loop are different from boundaries of new sub-trellises in a current iteration loop. From perspectives of a trellis, new sub-trellises are results of levelly shifting old sub-trellises, and the amount of the level shifting is not greater than the length of the sub-trellises.

To decode a sub-trellis, in one embodiment of the present invention, without involving additional training operation in the prior art, forward recursion and backward recursion are performed on the sub-trellis. In one sub-trellis, a forward state metric of a starting step of a sub-trellis needed in the forward recursion and a backward state metric of an ending step of a sub-trellis needed in the backward recursion are commonly referred to as stakes in the disclosure of the application. A stake is an initial condition needed when a sub-trellis is decoded. In one embodiment, the current stake of a sub-trellis is adopted directly from a state metric generated from performing forward recursion and backward recursion of a corresponding step of a previous iteration loop. For example, assume that, for a sub-trellis of a current iteration loop, the starting step is k+1, the ending step is k+L, and the window length is L. The stake of the trellis is the forward state metric $\alpha_{k+1}(n)$ and the backward state metric $\beta_{k+1}(n)$, where n=0 to N−1. When this sub-trellis is decoded, the stake of this sub-trellis is set as the forward state metric $\alpha_{k+1}(n)$ calculated in the forward recursion of the previous iteration loop, where n=0 to N−1, and the backward state metric $\beta_{k+1}(n)$ calculated in the backward recursion of the previous iteration loop, where n=0 to N−1.

The above decoding method does not involve any additional training operation. In other words, the current stake of the sub-trellis has already undergone a training operation in the forward and backward recursions of the previous loop, and thus has a certain level of reliability.

Figure 1:
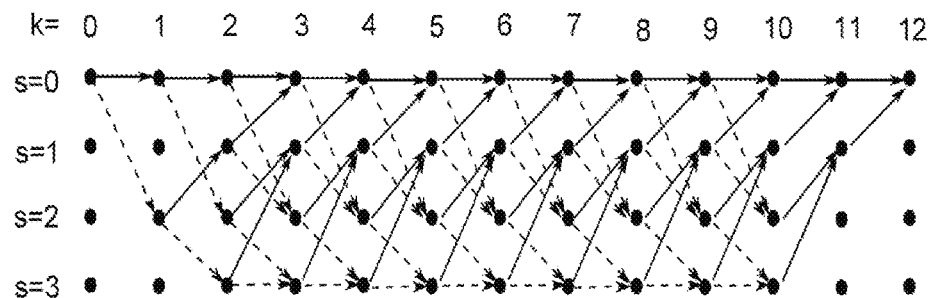
FIG. 1 shows a trellis.

In general, convolutional codes and turbo codes may be represented by a trellis, as shown in FIG. 1. The trellis in FIG. 1 includes 13 steps, each having four possible states to represent that the constraint length of an encoder is 2. In other words, block codes having a block length of 12 are obtained from the trellis in FIG. 1. For illustration purposes, in the description below, k represents a block code length, which represents the number of steps that one block code includes. As known in the prior art, a MAP decoder adopts forward recursion and backward recursion on a trellis to generate soft output. Based on received information, a MAP decoder minimizes the bit error probability after the decoding process.

Figure 2:
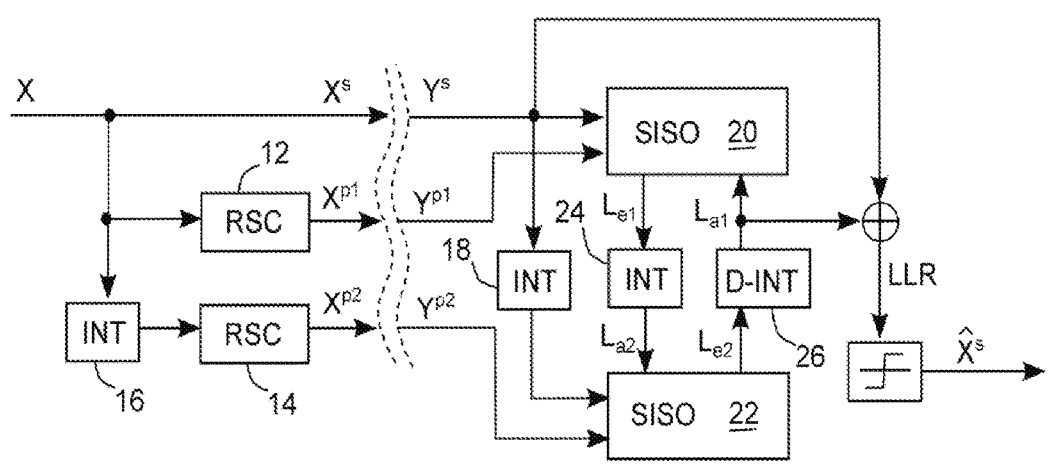
FIG. 2 shows a turbo encoder and decoder.

In FIG. 2, the left half shows a turbo encoder, and the right half shows a turbo decoder. A turbo encoder is generally formed by two parallel concatenated recursive systematic convolutional encoders RSC 12 and RSC 14, which are connected by an interleaver INT 16 in between. According to a block code X, the recursive systematic convolutional encoder RSC 12 generates a string of parity bits $x_k^{p1}$ that are in overall referred to as a parity code $X^{p1}$, where k=0 to K−1. Similarly, the recursive systematic convolutional encoder RSC 14 generates a parity code $X^{p2}$ according to an interleaved block code X. The block code X is also referred as a systematic block code $X^s$. Bits in the systematic block code $X^s$, the parity code $X^{p1}$ and the parity code $X^{p2}$ may be interleavingly connected and be outputted to a communication channel through a multiplexer. To increase the code rate, a part of parity bits may be omitted and not outputted. For example, only a part of the parity bits $x_k^{p1}$ and $x_k^{p2}$ of the same step are outputted to a communication channel, such that the turbo encoder in FIG. 2 may have a higher code rate.

The turbo encoder in FIG. 2 calculates the reliability of the received information, and represents the reliability in form of log-likelihood ratios (LLRs). Each LLR represents the probability of one corresponding bit being 0 and 1. Compared to the systematic block code $X^s$, the parity code $X^{p1}$ and the parity code $X^{p2}$, the turbo decoder generates systematic information $Y^s$, parity information $Y^{p1}$ and parity information $Y^{p2}$. For example, the systematic information $Y^s$ is formed by a string of LLRs $y_k^s$, and the parity information $Y_p^1$ is formed by a string of LLRs $y_k^{p1}$, where k=0 to K−1. The turbo decoder in FIG. 2 includes interleavers INT 20 and 24, soft-input-soft-output SISO 20 and 22, and a de-interleaver 26. Operations and iteration details of these elements substantially follow a Bahl, Cocke, Jelinek and Raviv (BCJR) algorithm, also referred to as a MAP algorithm. According to the systematic information $Y^s$ and the parity information $Y^{p1}$ as well as a priori information $L_{a1}$, the SISO 20 calculates soft output (usually representing the maximum posteriori probability by an LLR), which is referred to as extrinsic information $L_{e1}$. After an interleaving process, the extrinsic information $L_{e1}$ becomes a priori information $L_{a2}$. The SISO 22 calculates extrinsic information $L_{e2}$ according to the interleaved systematic information $Y^s$, the parity information $Y^{p2}$ and the a priori information $L_{a2}$. The extrinsic information $L_{e2}$ is processed by an interleaving process and becomes the a priori information $L_{a1}$ that is then fed back to the SISO 20. The process having been performed once by the SISO 20 or 22 is referred to as half-iteration, and the computation process having been performed once by the SISO 20 or 22 is referred to as one iteration. In general, such iteration loop is repeated for a fixed number of times, or is repeated until the number of changing symbols in the extrinsic information $L_{e1}$ or $L_{e2}$ in the iteration loop is as small as a predetermined level.

Under the condition that the foregoing MAP algorithm calculates a received message Y, the probability of the message bit being digital 1 or 0 at a step k, or referred to as a posteriori log-likelihood ratio L(uk|Y), is defined as below.

$$L(u_k \mid Y) = \ln \frac{P(u_k = +1 \mid Y)}{P(u_k = -1 \mid Y)}$$

The MAP algorithm calculates L(uk|Y) of each step k through forward and backward recursive operations on the trellis. L(uk|Y) is organized and represented as:

$$L(u_k \mid Y) = \ln \frac{\sum_{(n,m)\in u_k=1} \alpha_{k-1}(n) * \gamma_k(n,m) * \beta_k(m)}{\sum_{(n,m)\in u_k=-1} \alpha_{k-1}(n) * \gamma_k(n,m) * \beta_k(m)} \quad (1)$$

In equation (1), the branch metric $r_k(n,m)$ represents the probability of becoming a state m at the step k under conditions that the state is n at the step k−1 and the received message is Y, the forward state metric $\alpha_{k-1}(n)$ represents the probability that the state stays n from the step 0 to the step k−1 under a condition that the received message is Y, the backward state metric $\beta_k(m)$ represents the probability that the state stays m from the step K−1 to the step k under a condition that the received message is Y. The alphabet zigma (Σ) of the numerator refers to a calculated total of all branches that possibly generate $u_k$=1. Similarly, the alphabet zigma (Σ) of the denominator refers to a calculated total of all branches that possibly generate $u_k$=−1. As known in the prior art, the forward state metric $\alpha_k(m)$ and the backward state metric $\beta_k(m)$ may be respectively represented as:

$$\alpha_k(m) = \sum_{n=1}^{M} \alpha_{k-1}(n) * \gamma_k(n, m) \quad (2)$$

$$\beta_k(m) = \sum_{n=1}^{M} \beta_{k+1}(m) * \gamma_{k+1}(n, m) \quad (3)$$

It is known from equation (2) that, to calculate the forward state metric $\alpha_k(m)$, the forward state metric $\alpha$ prior to the step k needs to be first learned; it is known from equation (3) that, to calculate the backward state metric $\beta_k(m)$, the backward state metric $\beta$ subsequent to the step k needs to be first learned. Thus, the forward state metric $\alpha_k(m)$ and the backward state metric $\beta_k(m)$ are generally calculated and obtained through iteration, with however the directions of the iteration being opposite.

Figure 3:
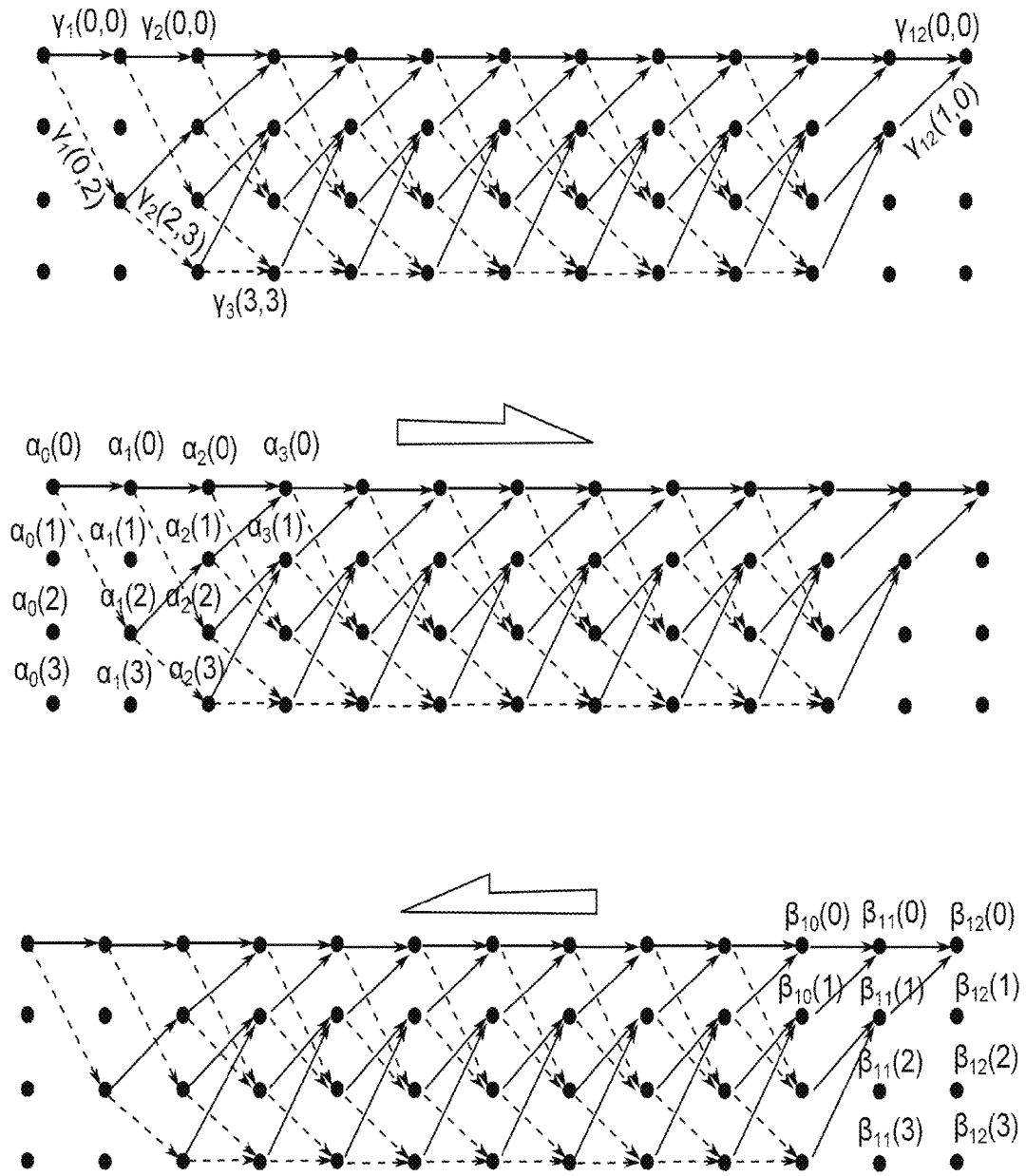
FIG. 3 shows a decoding process.

In equation (1), all $\alpha_{k-1}$ and $\beta_k$ are required for the calculation of $L(u_k|Y)$. In an operation for realizing equation (1), the branch metric r on each branch of the trellis, and the state metric (including the forward state metric $\alpha$ and the backward state metric $\beta$) of each state, are first calculated and stored into a memory, and the required $\alpha$, $\beta$ and r are then retrieved from the memory to calculate $L(u_k|Y)$. However, with such method, forward recursion and backward recursion need to undergo through all of the K number of steps of the entire trellis before any $L(u_k|Y)$ can be outputted. In FIG. 3, it is depicted that, all branch metrics $r_k(n,m)$ are first calculated, all forward state metrics $\alpha$ and then all backward state metrics $\beta$ calculated, and $L(u_k|Y)$ is eventually obtained. For a large block code length K, such operation method may produce a substantial output latency, and may thus be unpractical.

Figure 4:
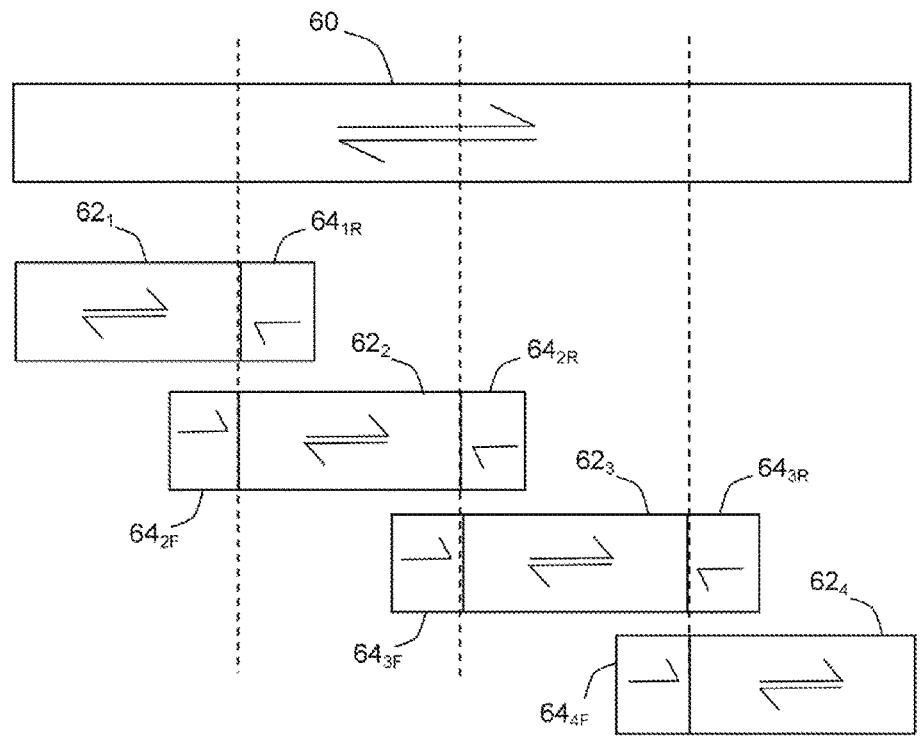
FIG. 4 shows a window technology.

FIG. 4 shows a type of window technology capable of reducing the issue of output latency. For example, the window technology divides a trellis 60 into a plurality of same-sized sub-trellises $62_1$ to $62_4$ by a window having a predetermined size, and performs forward recursion and backward recursion on each sub-trellis to calculate $\alpha$, $\beta$ and r, and then $L(u_k|Y)$ for each step k. However, when the window technologies is applied, the stake, i.e., the forward state metric of a starting step in the sub-trellis and the backward state metric of an ending step in the sub-trellis require additional training operations. Taking the sub-trellis $62_1$ for example, assume that the sub-trellis $62_1$ includes steps 0 to L1, i.e. the length of the sub-trellis is L. The forward state metric $\alpha_0(m)$, where m=0 to M1, is associated with the initial condition of the entire turbo code block, and is generally known and need not be calculated. However, the backward state metric $\beta_{L-1}(m)$, where m=1 to M1, needs to be obtained through the backward recursion of an extended trellis $64_{1R}$ (having a length R) following the sub-trellis $62_1$. Even though the backward state metric $\beta_{L+R-1}(m)$ of the backward recursion of the extended trellis $64_{1R}$ is possibly randomly guessed, the backward state metric $\beta_{L+R-1}(m)$ nonetheless becomes quite reliable after the having undergone the backward recursion that the extended trellis $64_{1R}$ provides. Similarly, the forward state metric $\alpha_L(m)$ of the sub-trellis $62_2$ needs to be obtained through the forward recursion of an extended trellis $64_{2F}$ prior to the sub-trellis $62_2$; the backward state metric $\beta_{2L-1}(m)$ of the sub-trellis $62_2$ needs to be obtained through the backward recursion of an extended trellis $64_{2R}$ following the sub-trellis $62_2$. The backward and forward recursion in the extended trellis are the foregoing additional learning operations. Through the window technology, although all sub-trellises are allowed to be processed in a parallel manner to reduce the output latency, additional learning operations are required.

Figure 5:
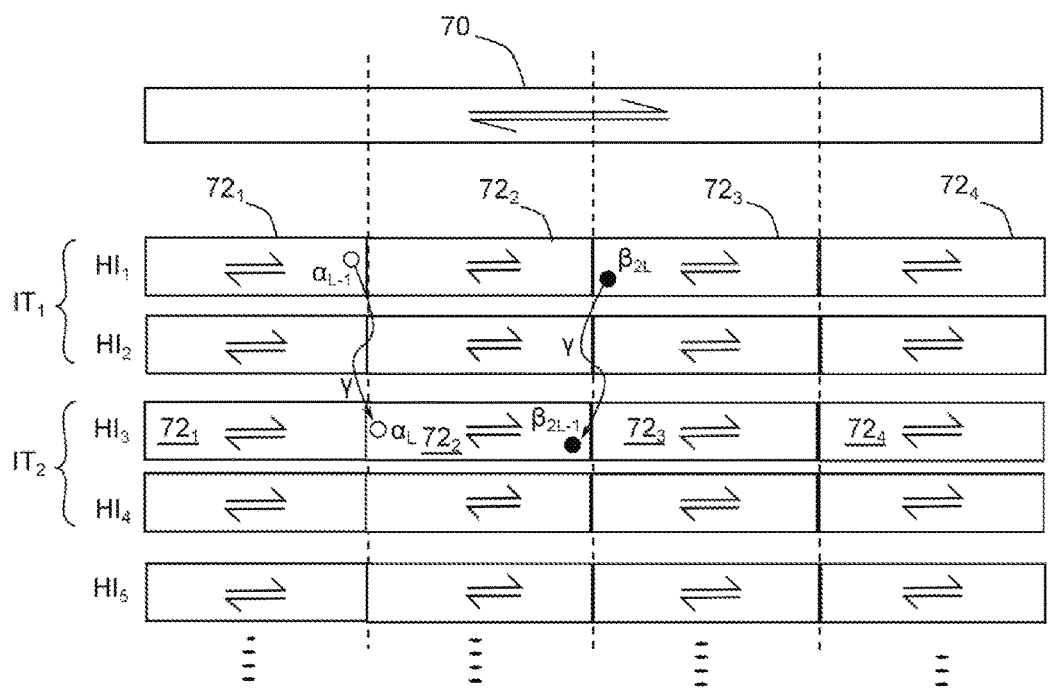
FIG. 5 shows a window decoding technology.

FIG. 5 shows a type of window decoding that eliminates the additional learning operation. Similarly, a trellis 70 is divided into a plurality of same-sized sub-trellises $72_1$ to $72_4$, each of which having a sub-trellis length L. In the decoding process, all of the sub-trellises $72_1$ to $72_4$ can similarly be processed in parallel. The $1^{st}$ half-iteration $HI_1$, and the $2^{nd}$ half-iteration $HI_2$ are collectively referred to as the $1^{st}$ iteration $IT_1$. The stake of each sub-trellis is an operation result of an adjacent sub-trellis of a previous iteration loop. For example, in the $3^{rd}$ half-iteration $HI_3$ in FIG. 5, the forward state metric $\alpha_L(m)$ of the starting step of the sub-trellis $72_2$ is adopted from the forward state metric $\alpha_{L-1}(m)$ generated by the sub-trellis $72_1$ and calculated according to equation (2) in the $1^{st}$ half-iteration $HI_1$. Similarly, in the $3^{rd}$ half-iteration $HI_3$, the backward state metric $\beta_{2L-1}(m)$ of the ending step of the sub-trellis $72_2$ is adopted from the backward state metric $\beta_{2L}(m)$ generated by the sub-trellis $72_3$ and calculated according to equation (3) in the $1^{st}$ half-iteration $HI_1$. In other words, in each iteration loop, in addition to decoding each of the parallel sub-trellises, the training operation is also at the same time performed, which is equivalently to preparing the information that the stake of the next iteration loop needs. Thus, the additional learning operations involved in FIG. 5 can be eliminated.

Figure 6:
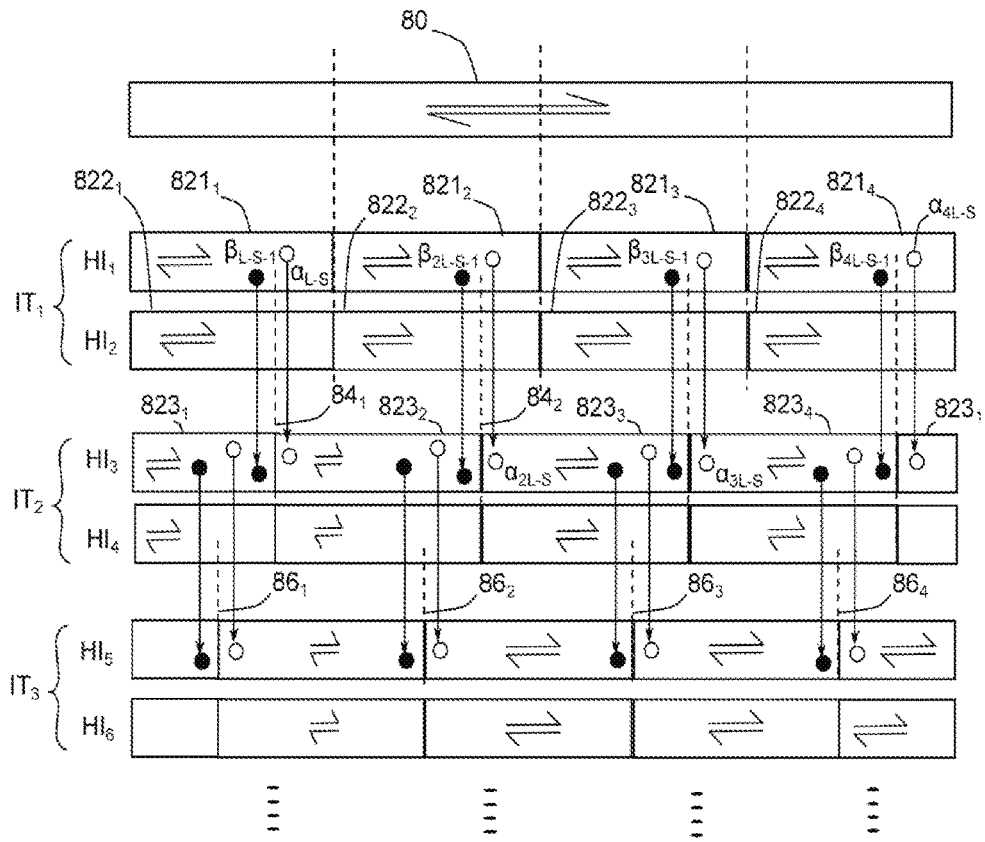
FIG. 6 shows window decoding adopted according to an embodiment of the present invention.

FIG. 6 shows parallel windowed decoding adopted according to an embodiment of the present invention. In addition to eliminating the additional learning operation, the embodiment further accelerates the converging speed of the iteration loop or reduces the bit error rate (BER). A trellis 80 in FIG. 6 is a circular trellis. That is, the condition of the last step of the trellis 80 is the same as that of the earliest step, and so the beginning and the end of the trellis 80 are connected to form a circle.

Similar to FIG. 5, in each half-iteration in the embodiment in FIG. 6, the trellis 80 is divided into a plurality of sub-trellises using a window having a fixed size. The sub-trellises have a same length L. In the embodiment, the block code length is K=4L. The trellis 80 is divided into four sub-trellises $821_1$ to $821_4$ in the $1^{st}$ half-iteration $HI_1$, divided into four sub-trellises $822_1$ to $822_4$ in the $2^{nd}$ half-iteration $HI_2$, divided into four sub-trellises $823_1$ to $823_4$ in the $3^{rd}$ half-iteration $HI_3$ using predetermined dividing lines $84_1$ to $84_4$, and so forth. In practice, each dividing line represents a specific step in the trellis 80. It should be noted that, after each iteration, the boundary of the sub-trellis is changed. For example, as the predetermined dividing lines $84_1$, $84_2$ ... are in the sub-trellises $821_1$, $821_2$ ..., i.e., the predetermined dividing lines are not aligned with the boundaries of the sub-trellises $821_1$, $821_2$ ..., the boundaries of the sub-trellises $821_1$, $821_2$ ... are not aligned with the boundaries of the sub-trellises $823_1$, $823_2$ .... For example, the sub-trellis $823_1$ is a result of a rear part of the sub-trellis $821_4$ connected to a front part of the sub-trellis $821_1$. Preferably, the position of each predetermined dividing line is the middle point between an S step and an S+1 step prior to the boundaries of each sub-trellis. Therefore, the sub-trellis $823_2$ is levelly shifted forward by S steps compared to the sub-trellis $821_2$.

In each half-iteration, four SISO decoders can be applied to decode four sub-trellises in a parallel manner. In the decoding process, forward recursion and backward recursion are performed to generate extrinsic information. Each SISO decoder uses a maximum a posterior (MAP) algorithm to calculate soft output of each step. The MAP algorithm may be a log-MAP, MAP, max-log-MAP or constant-log-MAP algorithm.

The stake needed for decoding a sub-trellis is adopted directly from the calculated result of a previous iteration, as shown in FIG. 6. In the $3^{rd}$ half-iteration $HI_3$ in FIG. 6, the forward state metric $\alpha_{L-S}(m)$ of the starting step of the sub-trellis $823_2$ may be duplicated directly from the forward state metric $\alpha_{L-S}(m)$ that is generated by the sub-trellis $821_1$ in the $1^{st}$ half-iteration $HI_1$ and is in the step L–S after the predetermined dividing line $84_1$. Similarly, the backward state metric $\beta_{2L-S-1}(m)$ of the ending step of the sub-trellis $823_2$ may be duplicated directly from the backward state metric $\beta_{2L-S-1}(m)$ that is generated by the sub-trellis $821_2$ in the $1^{st}$ half-iteration $HI_1$ and is in the step 2L–S–1 before the predetermined dividing line $84_2$. In the $1^{st}$ half-iteration $HI_1$, the forward state metric $\alpha_{L-S}(m)$ and the backward state metric $\beta_{2L-S-1}(m)$ need be especially recorded to readily serve as the stake required in the $3^{rd}$ half-iteration $HI_3$.

In FIG. 6, it is also shown that, in the $5^{th}$ half-iteration $HI_5$, the trellis 80 is divided into four sub-trellises by four predetermined dividing lines $86_1$ to $86_4$. In the $5^{th}$ half-iteration $HI_5$, the stake of each sub-trellis is adopted directly from the state metrics at two sides of the predetermined dividing lines $86_1$ to $86_4$ in the $3^{rd}$ half-iteration.

Similarly, although not shown in FIG. 6, the calculated result in the $2^{nd}$ half-iteration $HI_2$ may also be recorded to directly serve as the stake that each sub-trellis requires in corresponding steps in the $4^{th}$ half-iteration $HI_4$.

In FIG. 6, the stake is the result of the training operation of the previous iteration, and is entitled to a certain level of reliability. Taking the sub-trellis $823_2$ for example, the forward state metric $\alpha_{L-S}(m)$ has undergone the learning operations from the step 0 to the step L–S in a forward direction of the sub-trellis $821_1$, and the backward state metric $\beta_{2L-S-1}(m)$ has undergone the learning operations from the step 2L–1 to the step 2L–S–1 in a reverse direction of the sub-trellis $821_2$.

Compared to FIG. 5, without undergoing calculations of equation (2) and equation (3), the stake in FIG. 6 is duplicated directly from the state metric of the previous iteration, and calculation operations can be saved.

Compared to FIG. 5, FIG. 6 further reduces the BER. In FIG. 6, in the $1^{st}$ half-iteration $HI_1$, only $\alpha_1(m)$ and $\beta_K(m)$ are specific. Thus, in the $1^{st}$ half-iteration $HI_1$, the extrinsic information generated by the sub-trellises $821_1$ and $821_4$ is more reliable than the extrinsic information generated by the sub-trellises $821_2$ and $821_3$. For example, the a priori information used for decoding the sub-trellis $823_2$ may be divided into a front half and a rear half, which are mainly affected by the extrinsic information of the sub-trellises $821_1$ and $821_2$, respectively. For forward recursion, the front half of the a priori information of the sub-trellis $823_2$, having undergone operations of almost the entire sub-trellis $821_1$, provides a certain level of reliability. Similarly, for backward recursion, the rear half of the a priori information of the sub-trellis $823_2$, having undergone operations of a section of the sub-trellis $821_1$, also provides a certain level of reliability. In other words, in the $3^{rd}$ half-iteration $HI_3$, not only each sub-trellis has a more reliable stake that need not be again calculated, but also the a priori information obtained is more reliable. Compared to the embodiment in FIG. 6, in the embodiment in FIG. 5, dividing lines and positions of the sub-trellises are fixed, and so the associated a priori information is not assisted as the more reliable a priori information obtained in FIG. 6. Compared to the embodiment in FIG. 5, the embodiment in FIG. 6 reduces the BER. That is to say, the decoding in FIG. 6 is more robust. It should be noted that, the expression "dividing a trellis into a plurality of sub-trellises" is given for illustration purposes. In practice, data of one trellis may be stored as data of a plurality of non-overlapping sub-trellises. Alternatively, the decoding of the sub-trellises may be performed through determining a plurality of steps and starting to read data of a predetermined length (i.e., the sub-trellis length) from different steps.

Figure 7:
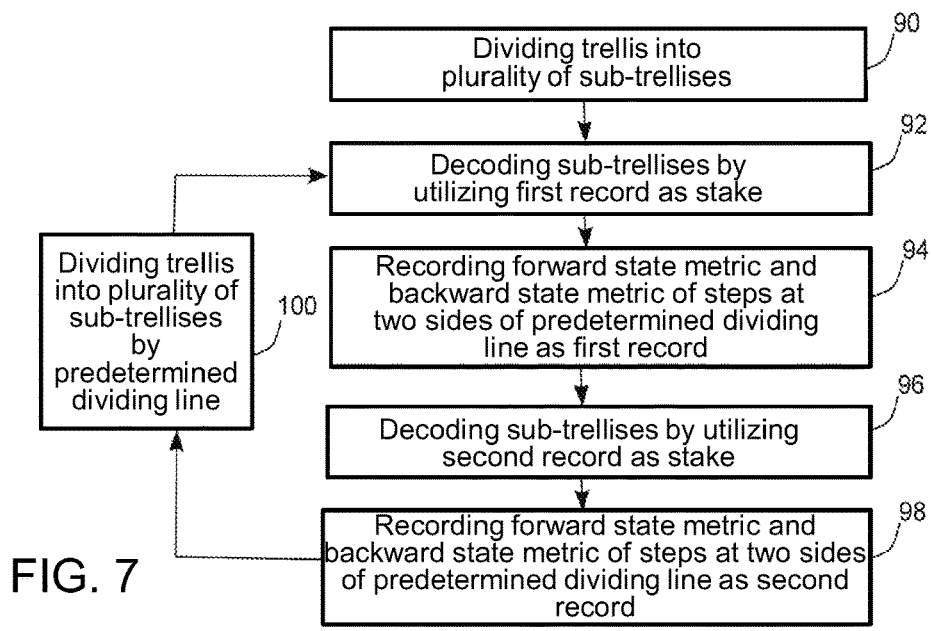
FIG. 7 shows a decoding method according to an embodiment of the present invention.

FIG. 7 shows a decoding method of the present invention. In step 90, a trellis is divided into a plurality of sub-trellises, each having the same length. In step 92, a first record is utilized as a stake and a priori information $L_{a1}$ is utilized as an input to decode the sub-trellises in a parallel manner to generate extrinsic information $L_{e1}$. Such is one half-iteration. In the $1^{st}$ half-iteration of the $1^{st}$ iteration, the stake may be set as a predetermined fixed value. For example, all $\alpha$ and $\beta$ serving as the stake are set to 0. In step 94, the first record is updated according to a forward state metric and a backward state metric at two adjacent steps of a predetermined dividing line in the sub-trellis. An interleaving process is performed on the extrinsic information $L_{e1}$ to generate a priori information L. In step 96, a second record is utilized as the stake and the a priori information $L_{a2}$ is utilized as an input to decode the sub-trellises in a parallel manner to generate extrinsic information $L_{e2}$. Such is another half-iteration. Similarly, in the $2^{nd}$ half-iteration of the $1^{st}$ iteration, the stake may be set as a predetermined fixed value. For example, all $\alpha$ and $\beta$ serving as the stake are set to 0. In step 98, the second record is updated according to a forward state metric and a backward state metric at two adjacent steps of a predetermined dividing line in the sub-trellis. An interleaving process is performed on the extrinsic information $L_{e2}$ to generate a priori information $L_{a1}$. At this point, one iteration loop is complete. In step 100, a next iteration is prepared, and the trellis is divided by predetermined lines to again generate a plurality of sub-trellises. The sub-trellises divided and generated in step 100 are divided and formed from old sub-trellises, and thus have different boundaries from the sub-trellises divided in step 90. Step 92 is performed after step 100 to perform another round of decoding on the trellis according to the newly divided sub-trellises.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A decoding method for a convolutionally coded signal of a communication system pre-storing recursion state metrics for decoding sub-trellises resulting in accelerating iteration loop convergence and reducing bit error rates, the convolutionally coded signal comprising a trellis with steps, the decoding method comprising:

determining a plurality of first sub-trellises from the trellis, and determining a corresponding step for each of the first sub-trellises, each corresponding step represented by a corresponding dividing line in the trellis, each dividing line distinct from the boundaries of all the first sub-trellises;

decoding the first sub-trellises to generate a plurality of state metrics;

storing a first record containing the plurality of state metrics generated prior to and subsequent to the corresponding steps;

determining a plurality of second sub-trellises from the trellis, the boundaries of each of the second sub-trellises being distinct and non-aligned with the boundaries of each of the first sub-trellises; and decoding the second sub-trellises by utilizing the first record as an initial condition of the second sub-trellises.

2. The decoding method according to claim 1, wherein the step of determining the second sub-trellises from the trellis is performed according to the corresponding steps.

3. The decoding method according to claim 1, wherein the step of decoding the first sub-trellises to generate the state metrics comprises:

decoding the first sub-trellises by forward recursion to generate a plurality of forward state metrics; and decoding the first sub-trellises by backward recursion to generate a plurality of backward state metrics;

wherein, each of the state metrics prior and subsequent to the corresponding steps comprises one of the forward state metrics and one of the backward state metrics.

4. The decoding method according to claim 1, wherein each of the first sub-trellises has a first sub-trellis length, each of the second sub-trellises has a second sub-trellis length, and the first sub-trellis length is equal to the second sub-trellis length.

5. The decoding method according to claim 1, wherein the step of decoding the first sub-trellises is decoding the first sub-trellises in a parallel manner.

6. The decoding method according to claim 1, wherein the steps of decoding the first and second sub-trellises are based on a soft-in-soft-out (SISO) decoding method.

7. The decoding method according to claim 1, wherein the step of decoding the first sub-trellises is a half-iteration of one iteration, and the step of decoding the second sub-trellises is a half-iteration of another iteration.

8. The decoding method according to claim 1, wherein the plurality of second sub-trellises from the trellis are determined such that a given step is represented by a corresponding dividing line in the trellis that is distinct from the boundary of each first sub-trellis, and the first record contains both the plurality of state metrics generated prior to the given step and the plurality of state metrics generated subsequent to the given step.

9. The decoding method according to claim 1, wherein the first record is updated according to a forward state metric and a backward state metric at a corresponding dividing line in the trellis for two adjacent steps in the first sub-trellis.

10. A decoding method for a convolutionally coded signal of a communication system pre-storing recursion state metrics for decoding sub-trellises resulting in accelerating iteration loop convergence and reducing bit error rates, the convolutionally coded signal comprising a trellis, the decoding method comprising:

determining a plurality of first sub-trellises from the trellis, wherein the first sub-trellises forms the trellis, the boundaries of all the first sub-trellises defined by a dividing line in the trellis corresponding to a given step;

decoding the first sub-trellises;

determining a plurality of second sub-trellises from the trellis, wherein the second sub-trellises forms the trellis, and boundaries of the second sub-trellises are non-aligned, distinct, and different from the boundaries of the first sub-trellises; and decoding the second sub-trellises.

11. The decoding method according to claim 10, wherein the first sub-trellises are non-overlapping.

12. The decoding method according to claim 10, further comprising:

when decoding the first sub-trellises, generating a plurality of state metrics for the first sub-trellises; and when decoding the second sub-trellises, utilizing the state metrics as initial conditions of the second sub-trellises.

13. The decoding method according to claim 10, wherein the step of decoding the first sub-trellises comprises:

decoding one of the first sub-trellises by forward recursion to generate a forward state metric, the forward state metric corresponding to a first step of the trellis; and decoding the one of the first sub-trellises by backward recursion to generate a backward state metric, the backward state metric corresponding to a second step of the trellis, the first and second steps being adjacent to each other, the second step being earlier than the first step; and the step of decoding the second sub-trellises comprises:

utilizing the backward state metric as an initial condition for decoding one of the second sub-trellises; and utilizing the forward state metric as an initial condition of another of the second sub-trellises, the another of the second sub-trellises following the one of the second sub-trellis.

14. The decoding method according to claim 10, wherein each of the first sub-trellises has a first sub-trellis length, each of the second sub-trellises has a second sub-trellis length, and the first sub-trellis length is equal to the second sub-trellis length.

15. The decoding method according to claim 10, wherein the step of decoding the first sub-trellises is decoding the first sub-trellises in a parallel manner.

16. The decoding method according to claim 10, wherein the first sub-trellises comprise a previous first sub-trellis and a next first sub-trellis, one of the second sub-trellises comprises a part of the previous first sub-trellis and a part of the next first sub-trellis, and the next first sub-trellis follows to the previous first sub-trellis.

17. The decoding method according to claim 10, further comprising:

providing a turbo decoder;

wherein, the turbo decoder decodes the trellis twice in one iteration loop, and the steps of decoding the first sub-trellises and the step of decoding the second sub-trellises are from different iteration loops.

18. The decoding method according to claim 10, wherein the step of decoding the first sub-trellises and the step of decoding the second sub-trellises calculate soft output for each step by utilizing a maximum a posteriori (MAP) algorithm, and the MAP algorithm is one of log-MAP, MAP, max-log-MAP and constant-log-MAP algorithms.

* * * * *